(12) United States Patent  (10) Patent No.: US 8,778,445 B2
Fairbourn  (45) Date of Patent: Jul. 15, 2014

(54) APPARATUS AND METHODS FOR FORMING MODIFIED METAL COATINGS

(75) Inventor: David C. Fairbourn, Sandy, UT (US)

(73) Assignee: MT Coatings, LLC, Cincinnati, OH (US)

( * ) Notice: Subject to any disclaimer, the term of this patent is extended or adjusted under 35 U.S.C. 154(b) by 0 days.

(21) Appl. No.: 13/266,209

(22) PCT Filed: May 8, 2009

(86) PCT No.: PCT/US2009/043234
§ 371 (c)(1),
(2), (4) Date: Oct. 25, 2011

(87) PCT Pub. No.: WO2010/128968
PCT Pub. Date: Nov. 11, 2010

(65) Prior Publication Data
US 2012/0040084 A1  Feb. 16, 2012

(51) Int. Cl.
*C23C 16/52* (2006.01)
*C23C 16/00* (2006.01)

(52) U.S. Cl.
USPC ............. 427/8; 427/248.1; 427/250; 427/252

(58) Field of Classification Search
USPC .................................. 427/8, 250, 252, 248.1
See application file for complete search history.

(56) References Cited

U.S. PATENT DOCUMENTS

| 6,485,780 | B1 * | 11/2002 | Sangeeta et al. | 427/180 |
| 6,993,811 | B2 * | 2/2006 | Das et al. | 29/23.51 |
| 7,390,535 | B2 * | 6/2008 | Fairbourn | 427/250 |
| 7,645,485 | B2 * | 1/2010 | Madhava | 427/252 |
| 2007/0116875 | A1 * | 5/2007 | Cetel et al. | 427/252 |
| 2008/0220165 | A1 * | 9/2008 | Fairbourn | 427/252 |

OTHER PUBLICATIONS

International Searching Authority, Search Report and Written Opinion issued in related International application No. PCT/US09/043234 dated Jul. 16, 2009.

* cited by examiner

*Primary Examiner* — Kelly M Gambetta
(74) *Attorney, Agent, or Firm* — Wood, Herron & Evans LLP

(57) ABSTRACT

Methods and systems for forming modified metal coatings on a gas turbine engine component (20). The gas turbine engine component (20) is placed inside a container (50) having a known volume, along with a source material (32) containing a secondary element. The container (50), gas turbine engine component (20), and the source material (32) inside the container are placed into an oxygen-depleted space (18) inside a reaction chamber (12). At least one temperature for the source material (32) is determined based upon the known volume of the container (50) and an amount of the source material (32). While in the oxygen-depleted space (18), the source material (32) is heated to the at least one temperature sufficient to release a vapor phase reactant (35) containing the secondary element. The vapor phase reactant (35) is confined inside the container (50) at an approximately constant pressure and the secondary element is deposited from the vapor phase reactant (35) as a layer (34) on the gas turbine engine component (20).

17 Claims, 2 Drawing Sheets

APPARATUS AND METHODS FOR FORMING MODIFIED METAL COATINGS

BACKGROUND

The invention relates to vapor deposition systems and, in particular, to methods and apparatus for forming a metal coating modified by the inclusion of a secondary element on a gas turbine engine component.

Gas turbine engines are used as aircraft or jet engines (e.g., turbofans) and as industrial gas turbine engines for power generation. Gas turbine engines contain components, such as turbine blades, vanes, shrouds, and nozzle guides, formed from metallic superalloy materials, such as a nickel-based superalloy or a cobalt-based superalloy. Superalloy components are exposed to extreme operating conditions in a gas turbine engine. Air flow or gas-washed surfaces may be directly contacted by the hot exhaust gases, which heat these components to high temperatures and expose them to impurity elements originating from the combusted fuel. Consequently, superalloys are susceptible to high temperature oxidation in this harsh environment.

Different protective coatings are used for components in the various stages of a gas turbine engine. The air flow or gas-washed surfaces on superalloy components in high-pressure stages are usually protected against high temperature oxidation by a sacrificial intermetallic coating, such as a diffusion aluminide coating. While the turbine engine is operating, a superficial oxide layer forms that protects the underlying superalloy base metal from high temperature oxidation. Unfortunately, the sacrificial intermetallic layer thins during engine operation and, eventually, must be replaced. Before a new sacrificial intermetallic layer is applied, the thinned layer is stripped from the superalloy base metal. This replacement process is repeated as many times as possible to prolong the service life of the turbine engine component in the gas turbine engine.

One technique for applying the sacrificial intermetallic coating on a turbine engine component is a simple chemical vapor deposition (CVD) process. A cleaned turbine engine component is placed into a reaction chamber containing an activator material and a donor material including at least one metal to be integrated into the alloy forming the intermetallic coating. The reaction chamber is purged of atmospheric gases and evacuated. By elevating the temperature of the reaction chamber, the activator material and donor material are heated to generate vapor phase reactants that cause metal to be transported from the donor material to the turbine engine component. The intermetallic coating formed on the turbine engine component may include intrinsic metal diffused outwardly from the alloy forming the turbine engine component. However, the intermetallic coating must also include at least one extrinsic metal originating from the donor material.

Diffusion aluminide coatings may be modified with platinum to improve their high-temperature oxidation resistance during cyclic oxidation. The improvement is believed to be primarily attributed to the corresponding enhancement of the adherence of the alumina scales in the protective oxide layer to the coated substrate in the presence of platinum. Despite this improvement in properties, replacements are being sought for platinum-modified diffusion aluminides.

Chromide coatings are also potentially capable of serving as protective coatings for superalloy components in the gas turbine engine. In particular, chromide coatings are favored for components in low-pressure stages of the gas turbine engine that are typically exposed in service to intermediate-range temperatures. Similar to aluminides, chromide coatings usually interdiffuse with the base metal in the substrate.

The properties of chromide and diffusion aluminide coatings may be improved by introducing performance enhancing secondary elements into the alloy. For example, modifications of silicon or hafnium are recognized to improve the high-temperature oxidation resistance of chromide and diffusion aluminide coatings. However, a problem that has been observed is an inability to reproducibly control the amount of silicon or hafnium that is introduced as a performance enhancing secondary element into the coating.

Accordingly, there is a need for improved methods and apparatus for forming a modified metal coating on superalloy gas turbine engine components.

SUMMARY

In accordance with an embodiment of the invention, a deposition method is provided that includes placing a gas turbine engine component inside a container having a known volume and placing a source material containing a secondary element inside the container. The container, the gas turbine engine component, and the source material inside the container are placed into an oxygen-depleted space. At least one temperature for the source material is determined based upon the known volume of the container and an amount of the source material. While in the oxygen-depleted space, the source material is heated to the at least one temperature sufficient to release a vapor phase reactant containing the secondary element. The vapor phase reactant is confined inside the container at an approximately constant pressure and the secondary element is deposited from the vapor phase reactant as a layer on an exterior surface of the gas turbine engine component.

By virtue of the foregoing, there is provided an improved method for forming an secondary element-modified metal coating on a superalloy gas turbine engine component that, upon heating in an oxidizing atmosphere, superficially oxidizes to form a protective external layer or shell constituted by a complex oxide that provides high temperature oxidation resistance to the base superalloy metal. For example, the secondary element supplied from the secondary element-containing layer to the metal coating may be silicon, hafnium, or both. As a result, the metal coating may be a chromide or aluminide coating that is silicon-modified, hafnium-modified, or modified by both secondary elements.

In another embodiment, a deposition apparatus is provided that includes a reaction chamber enclosing an interior space, a vacuum pump in fluid communication with the interior space of the reaction chamber, and a heating element configured to heat the reaction chamber. The vacuum pump is configured to evacuate the interior space so that the interior space in an oxygen-depleted state during deposition. A container is disposed inside the reaction chamber and in fluid communication with the interior space. The container has an interior space of a known volume that is volumetrically smaller than the interior space of the reaction chamber. The container is configured to hold a gas turbine engine component and a source material, and is configured to maintain the interior space of the container at an approximately constant pressure. A controller is configured to heat the source material to at least one temperature based upon the known volume of the interior space of the container and an amount of the source material to release a vapor phase reactant containing the secondary element that is confined by the container in proximity to the gas turbine engine component.

These and other objects and advantages of the present invention shall be made apparent from the accompanying drawings and description thereof.

BRIEF DESCRIPTION OF THE DRAWINGS

The accompanying drawings, which are incorporated in and constitute a part of this specification, illustrate an embodiment of the invention and, together with a general description of the invention given above, and the detailed description of the embodiment given below, serve to explain the principles of the invention.

DETAILED DESCRIPTION

Figure 1:
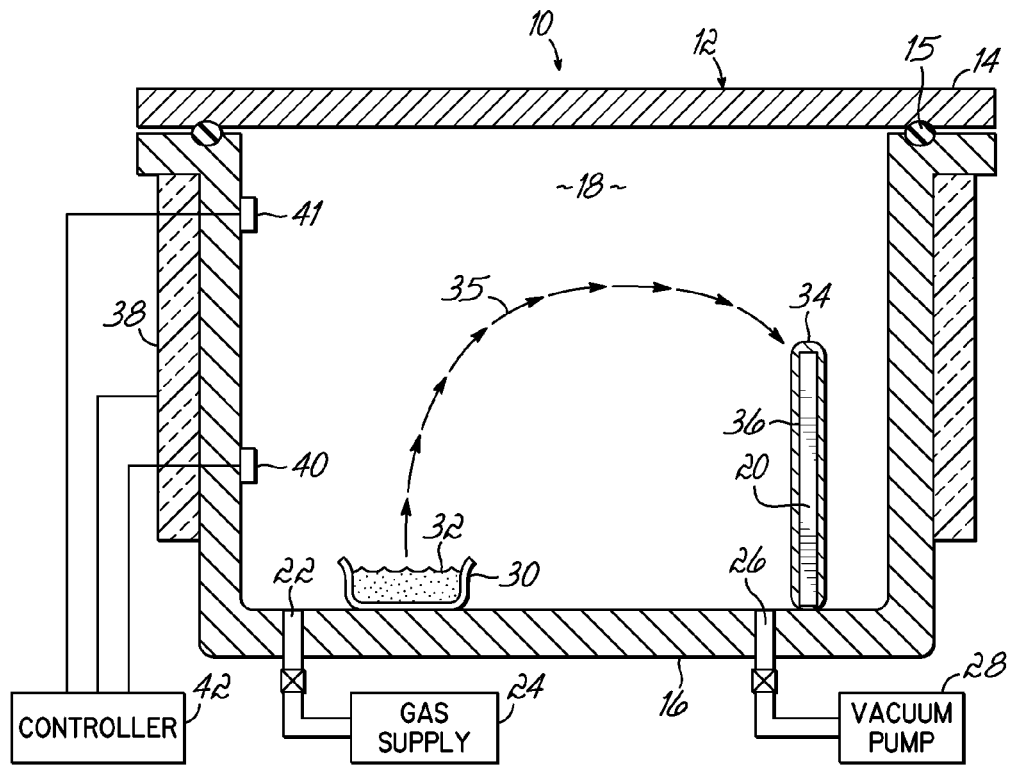
FIG. 1 is a diagrammatic view of a deposition system for depositing a layer containing a secondary element on a gas turbine engine component.

With reference to FIG. 1, a deposition system 10 generally includes a reaction chamber 12 consisting of a lid 14 and a vessel 16. The lid 14 has a sealing engagement with the vessel 16 promoted by an o-ring 15 that, when sealingly engaged, generally prohibits oxygen from entering the reaction chamber 12. After the lid 14 is sealingly engaged with the vessel 16 and the reaction chamber 12 is purged of atmospheric gases, an interior space 18 inside the reaction chamber 12 defines a deposition environment that is substantially depleted to oxygen. The lid 14 may be disengaged from the vessel 16 to introduce a turbine engine component 20 into the interior space 18 and re-engaged to contain the turbine engine component 20 within the deposition environment defined by the interior space.

The gas turbine engine component 20 is composed of a base metal alloy composed of a high temperature nickel-base, cobalt-base, or iron-base superalloy. The primary base metal, typically nickel, cobalt, or iron, in the alloy is by weight the single greatest element in the superalloy. For example, in a representative embodiment in which the application for the gas turbine component 20 is a jet engine, the gas turbine engine component 20 may be composed of a nickel-base superalloy such as Inconel 795 ModSA, MAR-M-247, or PWA 1484. The various embodiments of the present invention are, however, not intended to be limited to any particular gas turbine engine component 20 or any particular superalloy composition. In various embodiments, the gas turbine engine component 20 may be a turbine blade, a vane, a nozzle guide, or any other part requiring protection from high temperature oxidation while operating in a gas turbine engine.

The reaction chamber 12 includes an inlet port 22 and a gas supply 24 coupled with the inlet port 22. The gas supply 24 is configured to deliver a pressurized supply of an inert gas, such as argon, to the interior space 18 through a delivery line coupled with the inlet port 22. The reaction chamber 12 includes an exhaust port 26 that is coupled with a vacuum pump 28. The vacuum pump 28 is capable of evacuating the reaction chamber 12 to a suitable vacuum pressure greater than 120 Torr. The vacuum gas supply 24 and vacuum pump 28 cooperate to purge the reaction chamber 12 of reactive atmospheric gases, such as oxygen. The interior space 18 of reaction chamber 12 is evacuated using vacuum pump 28 and then backfilled with inert gas from the inert gas supply 24. The reaction chamber 12 is repeatedly evacuated and backfilled until the residual concentrations of reactive atmospheric gases are sufficiently low so as to not interfere with the subsequent deposition process. For example, the evacuation and backfill process may be executed for eight consecutive cycles to purge oxygen from the reaction chamber 12. Oxygen is excluded during the initial heating cycle and, during the entire coating cycle, this oxygen-excluded deposition environment is maintained without the addition of inert gas from the gas supply 24.

An open container in the form of a crucible 30 is disposed inside the reaction chamber 12. The turbine engine component 20 is placed inside the reaction chamber 12 in a spaced relationship with the crucible 30. Contained within the crucible 30 is a quantity of a source material 32 that operates a source for a secondary element to be deposited as, or within, a layer 34 on an exterior surface 36 of the turbine engine component 20. In one embodiment, the source material 32 is a volume of silicon bromide ($SiBr_4$), which is initially in a liquid phase when introduced into the crucible 30 at room temperature. In another embodiment, the source material 32 is a volume of a hafnium halide, such as hafnium chloride ($HfCl_4$), which is initially in a solid phase when introduced into the crucible 30 at room temperature. In yet another embodiment, the source material 32 in crucible 30 may be a combination of a material containing silicon and a material containing hafnium. The crucible 30 may be formed from a high temperature material, like high purity alumina, that does not contaminate the process with extraneous impurities.

With continued reference to FIG. 1, a heating element 38 is configured to heat the reaction chamber 12 and, thereby, heat the crucible 30 by a known thermal heat transfer mechanisms from the reaction chamber 12. The heating element 38 is operative for elevating the temperature of the source material 32 to a temperature of at least 500° F. Thermal sensors, such as thermocouples 40, 41, are used to sense and measure the temperature of the reaction chamber 12. The thermocouples 40, 41 may have a non-contacting relationship with any object inside the interior space 18 and the temperature of the reaction chamber 12 and all objects inside the reaction chamber 12, including the component 20 and the source material 32, may be assumed to be identical to the measured temperature because of temperature equilibration. Alternatively, the thermocouples 40, 41 may have an actual contacting relationship with the turbine engine component 20.

A controller 42, such as a programmable logic controller, is electrically coupled with the heating element 38 and with the thermocouples 40, 41. The controller 42 receives temperature signals from the thermocouples 40, 41 as an indication of the temperature of the reaction chamber 12 and uses those temperature signals as feedback to regulate the power supplied to the heating element 38 in a closed loop control system. The feedback control responds to deviations of the measured temperature from a targeted temperature, and is used to control an actual temperature of the source material 32 and component 20. The temperature of the reaction chamber 12 is used to control the temperature of the source material 32 in the crucible 30, which in turn regulates the deposition of the secondary element on the exterior surface 36 of the turbine engine component 20. Another temperature sensor, not shown, may detect the temperature of the heating element 38 and/or the actual exterior temperature of the reaction chamber 12, which is used along with the temperature signals from the thermocouples 40, 41 in feedback control. A secondary element (silicon, hafnium, or both) from the source material 32 is vaporized as a vapor phase reactant into the internal space 18 and a portion 35 of this vapor phase reactant deposits as the layer 34 on the exterior surface 36 of the turbine engine component 20.

The controller 42 may execute a proportional integral derivative (PID) algorithm based on feedback in the form of temperature signals from the thermocouples 40, 41 to determine the power applied to the heating element 38 based upon deviations of the sensed temperature from a temperature setpoint. Alternatively, the controller 42 may execute a proportional-derivative (PD) or a proportional-integral (PI) control algorithm. In this manner, the controller 42 provide a closed loop control system for the power supplied to the heating element 38. The controller 42 also receives input from a pressure sensor (not shown), which opens and closes the valve isolating the vacuum pump 28 to maintain the pressure inside the reaction chamber 12 within a given range. For example, as the vapor phase reactant containing the secondary element is released from the source material 32, the chamber pressure increases. In response, the controller 42 may open the valve to couple the vacuum pump 28 with the interior space 18 each time that a pressure set point is achieved so that the vacuum pressure inside the reaction chamber 12 does not exceed the pressure set point.

The silicon and/or hafnium that is deposited in layer 34 on the exterior surface 36 of the turbine engine component 20 is in an elemental form and has been found to be readily incorporated into a metal coating (i.e., a diffusion aluminide coating or a chromide coating) as a performance enhancing secondary element that improves high-temperature oxidation resistance. Silicon or hafnium contained within a different type of pre-applied layer on the exterior surface 36 is not effective in being successfully incorporated into a diffusion aluminide coating or a chromide coating as a performance enhancing secondary element. For example, silicon bound in a silicon dioxide layer on the exterior surface 36 prior to aluminiding or chromiding cannot be diffused into the metal coating. Similarly, silicon added to the donor material used during the simple chemical vapor deposition fails to result in the introduction of sufficient silicon into a diffusion aluminide layer to impact the high-temperature oxidation resistance. In addition, the amount of silicon and/or hafnium deposited onto the exterior surface 36 of the turbine engine component 20 and subsequently incorporated into the aluminide or chromide coating influences the high-temperature oxidation resistance of the diffusion aluminide or chromide layer. As explained below, the amount of secondary element deposited onto the exterior surface 36 can be controlled by controlling the volume of the environment about the turbine engine component 20 in which the vapor phase reactant is confined.

Figure 2:
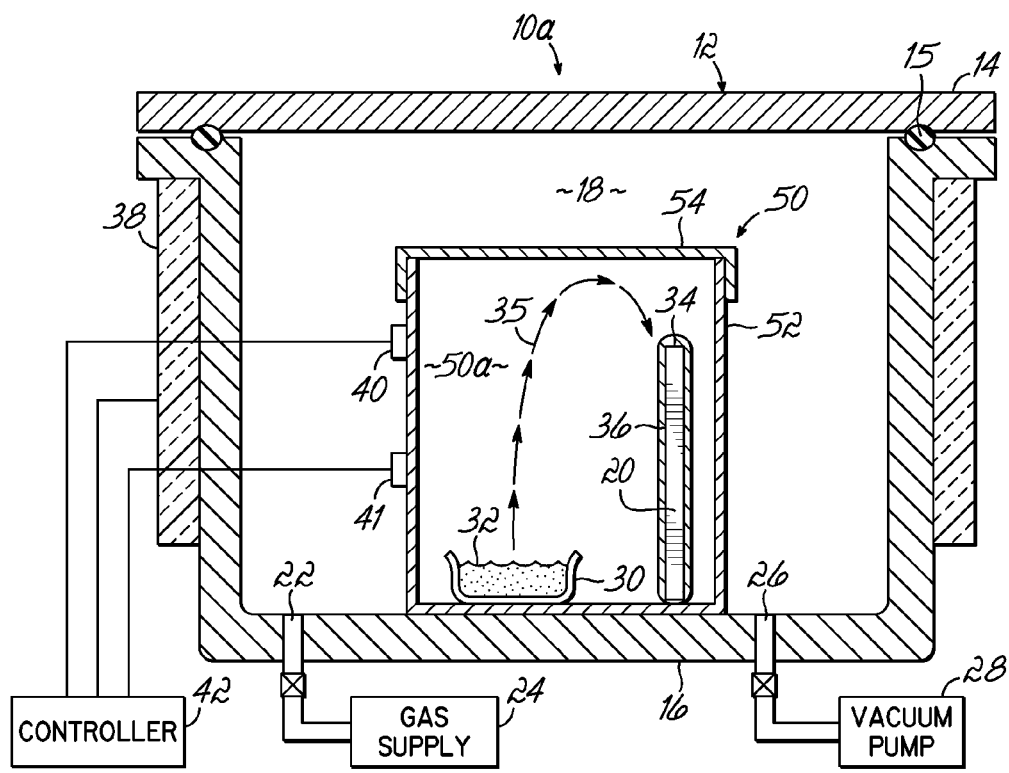
FIG. 2 is a diagrammatic view of another type of deposition system for depositing the layer of FIG. 1 on a gas turbine engine component.

With reference to FIG. 2 and in accordance with an alternative embodiment, a deposition system 10a confines the turbine engine component 20 and the source material 32 inside a partially-sealed container 50 that is placed into the reaction chamber 12. The container 50 includes a cup-shaped body 52 and a removable lid 54 that provides access to the interior of the container 50 for adding the source material 32 to the crucible 30 and placing the component 20 into the container 50. The container 50 provides confinement of the vapor phase reactant released from the source material 32 in the crucible 30, which increases the concentration of the vapor phase reactant and hence, the concentration of vaporized silicon or hafnium in the vicinity of the gas turbine engine component 20.

Selection of the temperature of the reaction chamber 12 and the confinement of the vaporized source material 32 at a substantially constant pressure inside the container 50 are used to control the temperature of the source material 32 in the crucible 30, which in turn regulates the deposition of silicon on the exterior surface 36 of the turbine engine component 20. To that end, the thermocouples 40, 41 may be placed into a contacting relationship with the container 50, as representatively shown, and are used to provide temperature indications reflecting the temperature of the container 50 to the controller 42 for closed loop feedback control. The feedback control responds to deviations of the measured temperature from a targeted temperature, and is used to control an actual temperature of the container 50, the component 20, and the source material 32. Alternatively, the thermocouples 40, 41 may have a non-contacting relationship with any object inside the interior space 18, as shown in FIG. 1, and the temperature of the reaction chamber 12 and all objects inside the reaction chamber 12, including the container 50, the component 20, and the source material 32, may be assumed to be identical because of thermal equilibration.

The container 50 may be constructed from materials such as Inconel 600, Inconel 601, or Nickel 200. In the representative embodiment, the body 52 of the container 50 has the shape of a right circular cylinder with a cylindrical sidewall welded to a disk-shaped base. In one embodiment, the body 52 of the container 50 may have a height of about 6 inches and a diameter of about 10 inches so that the container 50 has a volume of about 470 cubic inches (7.7 liters). In one embodiment, the lid 54 may fit snugly over the top of the cylindrical sidewall of the body 52 and cover approximately 1.2 inches down the side of the sidewall.

The use of the container 50 may eliminate the need for a dedicated deposition system 10 to perform the deposition of the secondary element onto the turbine engine component 20 as the vapor phase reactant is largely confined within the container 50, which increases the likelihood that the secondary element contained in the vapor phase reactant will deposition on the exterior surface 36 of the turbine engine component 20 and not escape into the reaction chamber 12. The lid 54 has a non-sealed or leaky engagement with the body 52 so that the interior space inside the container 50 communicates with the interior space 18 of the reaction chamber 12. This non-sealed engagement communicates the vacuum of the interior space 18 to an interior space 50a of the container 50 through this flow-restricted path. At room temperature, the interior space 50a of the container 50 and the interior space 18 of the reaction chamber 12 are at approximately the same pressure. At higher temperatures, the vapor phase reactant 35 is able to leak from the container 50 at an approximately constant rate at any temperature. As a result of the flow restriction provided by the leaky engagement of the lid 54 with the body 52, the vapor phase reactant 35 is primarily contained inside the interior space 50a of the container 50, but may partially escape from the interior space 50a of container 50 to the interior space 18 of the reaction chamber 12. At any temperature, a constant pressure is established for the vapor phase reactant 35 inside the interior space 50a of the container 50.

The use of the container 50 presents a fixed volume within which the vapor phase reactant containing the secondary element is concentrated and confined about the component 20. Within measurement accuracies, the fixed volume of container 50 is a known quantity. The volume may be readily determined by a calculation based upon the easily measured interior dimensions of the container 50. The pressure within the container 50 is likewise approximately constant because of the substantially closed state and the constant rate leakage that maintains the pressure regulation. Therefore, based upon the well-known perfect gas law, the concentration of the secondary element in the vapor phase reactant generated from the source material 32 is only a function of temperature as the pressure inside the container 50, the interior volume of the container 50, and the number of moles of source material 32 are constants. By controlling the temperature, a precise amount of the secondary element may be deposited from the vapor phase reactant 35 in the layer 34. In certain embodiments, the amount is controlled to within ±0.1 percent of a targeted amount based upon temperature control.

Reaction chamber 12 represents an enclosed retort system in which oxygen is excluded during the initial heating cycle and, during the entire coating cycle, is maintained without the addition of an inert gas, such as argon. The environment inside the reaction chamber 12 is therefore tightly controlled. By controlling of the heating cycle, the number of moles, n, of reactant in source material 32, and the volume of the container 50, the concentration of the reactant gas inside the container 50 is a direct function of temperature, which can be tightly controlled by the controller 42 using temperature feedback from the thermocouples 40, 41. The need for additional secondary equipment is averted as the process can be performed, because of the use of the container 50, in an o-ring sealed, enclosed retort of existing deposition equipment as embodied by the reaction chamber 12 of deposition system 10.

Figure 3:
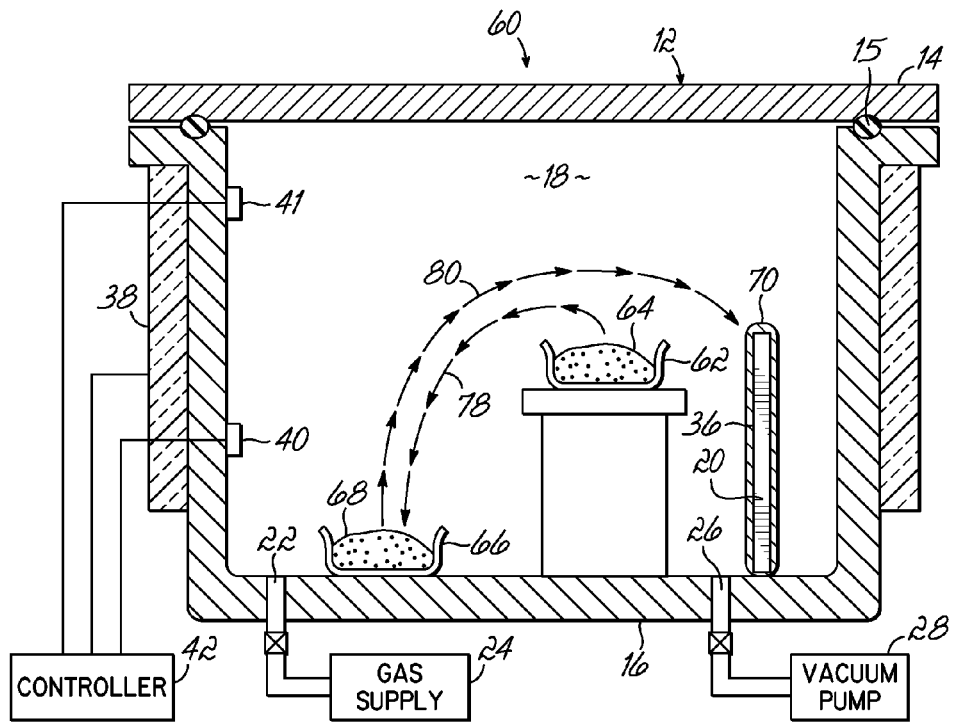
FIG. 3 is a diagrammatic view of a simple CVD apparatus used to form a secondary element-modified diffusion metal coating on the gas turbine engine component coating using the pre-applied layer of FIG. 1 or FIG. 2.

With reference to FIG. 3 in which like reference numerals refer to like features in FIG. 1, a deposition system 60 further includes a container in the form of a crucible 62 holding a mass or charge of a solid donor material 64, a container in the form of a crucible 66 holding a mass or charge of an activator material 68, and the turbine engine component 20 processed by the deposition system of FIG. 1. Suitable solid donor materials 64 include alloys of chromium and aluminum, alloys of cobalt and aluminum, and alloys of vanadium and aluminum. The donor material 64 may be provided as solid chunklets, a granulated material, or a solid powder, as shown in the representative embodiment, that is separate from and independent of turbine engine component 20. The donor material supplies an extrinsic metal, such as aluminum, to a metal coating 70 formed on the turbine engine component 20. Appropriate activator materials 68 suitable for use in the invention include, but are not limited to, aluminum fluoride, aluminum chloride, chromium II chloride, ammonium fluoride, ammonium bifluoride, and ammonium chloride. In the deposition system 60, the heating element 38 is operative for raising the temperature of the donor material 64 and the activator material 68 to a temperature (e.g., approximately 2200° F. or higher) sufficient to generate a vapor phase reactant containing an element or elements from the donor material 64. A vapor originating from the activator material 68 promotes the release of the vapor phase reactant from the donor material 64 at the elevated temperature, which is confined within the interior space 18 of the reaction chamber 12. The metal coating 70 formed on the turbine engine component 20 has the form and composition of a diffusion aluminide coating, and is modified by the addition of the secondary element, such as silicon and/or hafnium, from the preapplied layer 34.

Alternatively, the coating 70 formed on the turbine engine component 20 may have the form and composition of a chromide coating. In this instance, the solid donor material 64 in crucible 62 may be chromium in a powdered, granulated, or chunklet form. The vapor released at elevated temperatures from the activator material 68 reacts with the solid chromium to produce a gaseous chromium-containing compound as a vapor phase reactant. In this instance, the metal coating 70 is modified by the addition of the secondary element from the preapplied layer 34.

Figure 4:
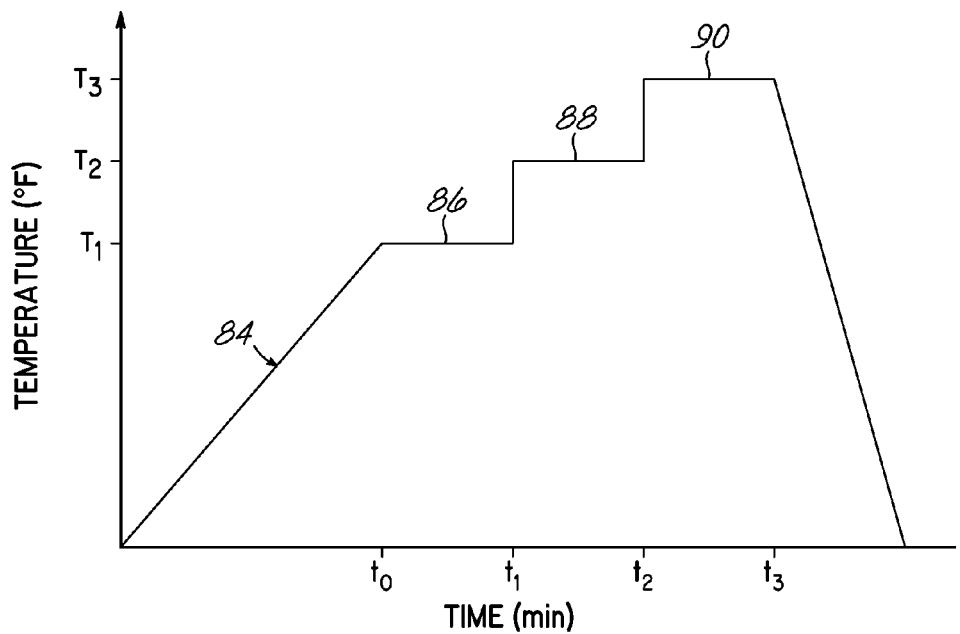
FIG. 4 is a graphical view of a heating profile used in the deposition system of FIG. 1 or in the deposition system of FIG. 2 to deposit the pre-applied layer containing the performance enhancing secondary element on the gas turbine engine component.

With reference to FIG. 4, the reaction chamber 12 of FIG. 1 or the container 50 of FIG. 2 may be heated in accordance with a heating profile 84 that includes a plurality of different isothermal heating levels 86, 88, 90. The temperature is ramped to the first heating level 86 and held at the temperature, $T_1$, of the first heating level 86 for a first time period extending from $t_0$ to $t_1$. The temperature is ramped to the second heating level 88 and held at the temperature, $T_2$, of the second heating level 88 for a second time period extending from $t_1$ to $t_2$. The temperature is ramped to the third heating level 90 and held at the temperature, $T_3$, of the third heating level 90 for a third time period extending from $t_2$ to $t_3$. The transitions between the different heating levels 86, 88, 90 are relatively abrupt. The time periods for the heating levels 86, 88, 90 are of equal duration, although the embodiments of the invention are not so limited. Similarly, the temperatures at the different heating levels 86, 88, 90 may be selected to have different values. However, the temperatures are isothermal at each of the different heating levels 86, 88, 90 to within ±10° F. under the closed-loop control of controller 42.

Although three heating levels 86, 88, 90 are present in the representative embodiment, two heating levels or more than three heating levels may be present in the heating profile 84. Similarly, in the representative embodiment, the temperature increase from the first heating level 86 to the second heating level 88 is equal in magnitude to the temperature increase from the second heating level 88 to the second heating level 90. However, these temperature increases are not so limited and may differ as the temperature is incremented upwardly.

In the representative embodiment, the first, second, and third heating levels 86, 88, 90 may be respectively characterized by temperatures of 600° F., 700° F., and 800° F., and each time period is equal to about 30 minutes. This type of heating profile may be suitable to vaporize and deposit silicon as the secondary element in layer 34 on the exterior surface 36 of the turbine engine component 20 from a source material 32 consisting of a volume of silicon bromide. Alternatively, the first, second, and third heating levels 86, 88, 90 may be respectively characterized by temperatures of 840° F., 950° F., and 1090° F., and each time period is equal to about 30 minutes. This type of heating profile may be suitable to vaporize and deposit hafnium as a secondary element in layer 34 on the exterior surface 36 of the turbine engine component 20 from a source material 32 consisting of a volume of hafnium chloride.

The heating profile 84 constrains the source material 32 to initially vaporize with a lower initial vaporization rate at heating level 86, which has the lowest temperature of the heating levels 86, 88, 90. The vaporization rate increases at heating level 88, which is characterized by the intermediate temperature, and has a relative maximum at the temperature of heating level 90. The controlled heating in accordance with the stepped heating profile 84 of FIG. 4 contrasts with simply elevating the temperature immediately to the heating level characterized by the highest vaporization rate. The container 50 has a fixed volume that is substantially smaller than the fixed volume of the interior space 18 of the reaction chamber 12. The use of the container 50 also reduces the volume into which the vapor phase reactant originating from the source material 32 must expand in comparison with the entire interior space 18 for deposition on turbine engine component 20.

This, in turn, promotes the conservation of the source material 32 as a smaller mass of source material 32 is required to provide the requisite concentration of vapor phase reactant to deposit on the exterior surface 36 of the turbine engine component 20. The container 50 provides a more controlled residence time and better controlled temperature for the vapor phase reactant about the exterior of the turbine engine component 20.

In use and with continued reference to FIGS. 1-4, layer 34 is applied to the exterior surface 36 of the turbine engine component 20 using either the deposition system 10 or the deposition system 10*a*. To that end, the turbine engine component 20 is introduced into the reaction chamber 12 and a suitable amount of the source material 32 is placed into crucible 30 inside the reaction chamber 12.

The amount of source material 32 to be placed in the crucible 30 either inside the container 50 or inside the reaction chamber 12 is based upon the surface area of the exterior surface 36 of the turbine engine component 20. Various techniques may be used to determine surface area. The surface area of an object with a regular geometrical shape may be determined mathematically. Surface area may be determined from dimensions on engineering drawings or by analyzing CAD files. Surface area may be determined by applying squares of tape of a given area and mass in a single-thickness layer to cover the exterior surface 36, removing all of the tape and determining the mass, dividing the total mass by mass per square to obtain the number of squares, and multiplying this result by the area per square.

The lid 14 is sealed and the interior space 18 of the reaction chamber 12 is purged of atmospheric gases by repeatedly admitting an inert gas from gas supply 24 through inlet port 22 and evacuating through exhaust port 26 with vacuum pump 28. The heating element 38 is operated according to the heating profile in FIG. 4, or a similar stepped heating profile, to vaporize the source material 32, which is released as a vapor phase reactant containing the secondary element (e.g., silicon and/or hafnium) and is transported to the exterior surface 36 of turbine engine component 20 for deposition as layer 34. Controlling the temperature, in conjunction with the selection of the amount of the source material 32, determines the amount of silicon and/or hafnium deposited in layer 34 (e.g., the layer thickness) and, ultimately, the amount of the performance enhancing secondary element incorporated into the metal coating 70.

At least one turbine engine component 20 with the exterior surface 36 covered by layer 34 is introduced into the reaction chamber 12 of the aluminide deposition system 60. A charge of the donor material 64 and a charge of the activator material 68 are placed into the crucibles 62 and 66 inside the reaction chamber 12. The lid 14 is sealed and the interior space 18 of the reaction chamber 12 is purged of atmospheric gases by repeatedly admitting an inert gas from gas supply 24 through inlet port 22 and evacuating through exhaust port 26 with vacuum pump 28. The heating element 38 is operated to vaporize the activator material 68, which interacts with the donor material 64 as indicated diagrammatically by reference numeral 78 to release a vapor phase reactant containing extrinsic metal from the donor material 64. The vapor phase reactant transports the extrinsic metal to the turbine engine component 20, as indicated diagrammatically by reference numeral 80.

The extrinsic metal present in the vapor phase reactant combines at the exterior surface 36 of the turbine engine component 20 with the metal(s) from component 10 and the silicon in the layer 34 to form the modified diffusion aluminide coating 70 containing the secondary element. Persons of ordinary skill in the art will recognize that additional steps, such as soaks and cleaning cycles, may be involved in the coating process. The turbine engine component 20 is removed from the reaction chamber 12. In a heated oxidizing environment, such as when the turbine engine component 20 is in service on an aircraft, oxidation of the exposed surface of the secondary element-modified diffusion aluminide coating 70 forms a complex oxide that protects the underlying superalloy material from damage.

The modified diffusion aluminide coating 70 residing on the turbine engine component 20 has a limited service life in the gas turbine engine and is gradually eroded away during operation. Periodically, the turbine engine component 20 must be inspected and possibly removed from service for re-application of the modified diffusion aluminide coating 70. Alternatively, the turbine engine component 20 may be removed from service at regular intervals for reapplying the modified diffusion aluminide coating 70. After removal from service, any existing complex oxide layer and residual modified diffusion aluminide coating 70 on the turbine engine component 20 is removed such as by acid stripping and/or grit blasting to expose a fresh surface of the component 20. The turbine engine component 20 is again covered with another modified diffusion aluminide coating 70, according to the principles of the embodiments of the invention, and returned to service in the gas turbine engine.

The secondary element is present in a confined amount of material that differs from the chemical composition of the base alloy of the coating 70 or that modifies the chemical composition of the base alloy of the coating 70. Generally, the presence of either hafnium or silicon as a secondary element improves the oxidation and/or corrosion resistance of the coating 70. However, the maximum amount of the secondary element in the coating 70 should be limited to 5 weight percent or less of the coating 70.

While the present invention has been illustrated by the description of an embodiment thereof and specific examples, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and methods and illustrative examples shown and described. Accordingly, departures may be made from such details without departing from the scope or spirit of applicant's general inventive concept.

What is claimed is:

1. A deposition method for use with a gas turbine engine component, the method comprising:

placing the gas turbine engine component inside a container having a known volume;

placing a source material configured to release a vapor phase reactant when heated to a vaporization temperature inside the container, the vapor phase reactant containing a secondary element;

placing the container, the gas turbine engine component, and the source material into a space that is then depleted of oxygen;

determining at least one temperature for the vapor phase reactant based upon the known volume of the container, an amount of the source material, and a targeted pressure of the vapor phase reactant inside the container;

while the container is in the oxygen-depleted space, heating the source material to the at least one temperature greater than the vaporization temperature to release the vapor phase reactant;

controlling the temperature of the vapor phase reactant while confining the vapor phase reactant inside the container to maintain the vapor phase reactant inside of the container approximately constant at the target pressure; and depositing the secondary element from the vapor phase reactant as a layer on an exterior surface of the gas turbine engine component.

2. The deposition method of claim 1 further comprising:
removing the gas turbine engine component from the container; and
forming a modified metal coating on the exterior surface of the gas turbine engine component such that the secondary element from the layer is included in the metal coating.

3. The deposition method of claim 2 wherein the source material is silicon bromide, the secondary element is silicon, and the modified metal coating is a diffusion aluminide layer or a chromide layer that includes the silicon.

4. The deposition method of claim 2 wherein the source material is a hafnium halide, the secondary element is hafnium, and the modified metal coating is a diffusion aluminide layer or a chromide layer that includes the hafnium.

5. The deposition method of claim 1 wherein controlling the temperature further comprises: heating the vapor phase reactant to a plurality of different temperature levels to change the pressure of the vapor phase reactant within the container.

6. The deposition method of claim 5 wherein the plurality of different temperature levels progressively increase with increasing time.

7. The deposition method of claim 5 wherein the temperature at each of the plurality of different temperature levels is approximately isothermal.

8. The deposition method of claim 5 wherein each of the temperature levels is associated with a respective one of a plurality of time intervals.

9. The deposition method of claim 8 wherein the time interval at each of the plurality of different temperature levels is approximately isochronal.

10. The deposition method of claim 1 further comprising:
determining a surface area for the exterior surface of the gas turbine engine component; and
specifying the temperature of the vapor phase reactant and the fixed amount of the source material based upon the surface area.

11. The deposition method of claim 1 further comprising:
measuring a temperature of the container; and
in response to a deviation of the measured temperature from a targeted temperature, controlling an actual temperature of the container to control the pressure of the vapor phase reactant.

12. The deposition method of claim 11 wherein the measured temperature of the container is measured by at least one thermocouple placed in a contacting relationship with the container or in a non-contacting relationship with the container.

13. The deposition method of claim 11 further comprising:
controlling an actual temperature of the container based upon the measured temperature to deposit a targeted amount of the secondary element in the layer on the exterior surface of the gas turbine engine component.

14. The deposition method of claim 13 wherein an amount of the secondary element deposited on the exterior surface of the gas turbine engine component is controlled to within ±0.1 percent of the targeted amount.

15. The deposition method of claim 1 wherein the oxygen-depleted space is defined by a reaction chamber having a volume larger than the known volume of the container and wherein confining and heating the vapor phase reactant produces the approximately constant pressure inside the container that is greater than the pressure in the reaction chamber outside of the container.

16. The deposition method of claim 1 wherein during heating of the source material, the approximately constant pressure of the vapor phase reactant within the container is maintained without the addition of an inert gas.

17. A deposition method for use with a gas turbine engine component, the method comprising:
placing the gas turbine engine component inside a container having a known volume;
placing a source material containing a secondary element inside the container, the source material being configured to release a vapor phase reactant when heated to a vaporization temperature;
placing the container, the gas turbine engine component, and the source material into a reaction chamber;
evacuating the reaction chamber and the container so as to deplete the container of oxygen;
determining a targeted temperature for the vapor phase reactant based upon the known volume of the container, a targeted amount of the secondary element to be deposited, and a targeted pressure of the vapor phase reactant within the container during deposition;
heating the source material to the targeted temperature greater than the vaporization temperature to release the vapor phase reactant containing the secondary element of a predetermined concentration and producing an approximately constant pressure of the vapor phase reactant at the target pressure inside the container; and
controlling the temperature of the vapor phase reactant to control the pressure of the vapor phase reactant inside the container to deposit the secondary element as a layer on an exterior surface of the gas turbine engine component.

* * * * *